United States Patent
Bahl et al.

(10) Patent No.: US 7,294,848 B2
(45) Date of Patent: Nov. 13, 2007

(54) LIGHT-EMITTING GROUP IV SEMICONDUCTOR DEVICES

(75) Inventors: Sandeep R. Bahl, Palo Alto, CA (US); Glenn H. Rankin, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 111 days.

(21) Appl. No.: 11/138,925

(22) Filed: May 26, 2005

(65) Prior Publication Data

US 2006/0267151 A1    Nov. 30, 2006

(51) Int. Cl.
H01L 29/06    (2006.01)
H01L 31/072   (2006.01)
H01L 31/109   (2006.01)
H01L 31/0328  (2006.01)
H01L 31/0336  (2006.01)
H01L 33/00    (2006.01)
H01L 31/12    (2006.01)

(52) U.S. Cl. ............... 257/19; 257/18; 257/21; 257/86; 257/102

(58) Field of Classification Search ............ 257/12–22, 257/77–103
See application file for complete search history.

(56) References Cited

U.S. PATENT DOCUMENTS

| | | | |
|---|---|---|---|
| 5,012,304 | A |  4/1991 | Kash et al. |
| 6,030,266 | A |  2/2000 | Ida et al. |
| 6,872,641 | B1 |  3/2005 | Chidambarrao et al. |
| 2003/0150376 | A1 |  8/2003 | Homewood et al. |
| 2005/0167653 | A1* |  8/2005 | Mears et al. .................. 257/18 |
| 2006/0270086 | A1* | 11/2006 | Rankin et al. ................ 257/86 |

| | | | |
|---|---|---|---|
| 2007/0069195 | A1* | 3/2007 | Park et al. ..................... 257/19 |

FOREIGN PATENT DOCUMENTS

EP    1727214 A2 *   11/2006

OTHER PUBLICATIONS

Kevin P. Homewood et al., "Light from Si via dislocation loops," Materials Today, pp. 34-39 (Jan. 2005).

G.Z. Pan et al., "(113) Defect-Engineered Silicon Light-Emitting Diodes," IEDM Tech Digest, pp. 343-346, Dec. (2004).

M. Kittler et al., "Silicon-based light emission after ion implantation," Optoelectronic Integration on Silicon edited by David J. Robbins et al., Proc. of SPIE vol. 5357, Jul. 2004, pp. 164-171.

M. Milosavlijevic et al., "Engineering of boron-induced dislocation loops for efficient room-temperature silicon light-emitting diodes," Journal of Applied Physics, vol. 97 (2005).

(Continued)

Primary Examiner—Cuong Nguyen

(57) ABSTRACT

In one aspect, a semiconductor device includes a p-region and an n-region. The p-region includes a first Group IV semiconductor that has a bandgap and is doped with a p-type dopant, and a first region of local crystal modifications inducing localized strain that increases the bandgap of the first Group IV semiconductor and creates a conduction band energy barrier against transport of electrons across the p-region. The n-region includes a second Group IV semiconductor that has a bandgap and is doped with an n-type dopant, and a second region of local crystal modifications inducing localized strain that increases the bandgap of the second Group IV semiconductor and creates a valence band energy barrier against transport of holes across the n-region.

36 Claims, 7 Drawing Sheets

OTHER PUBLICATIONS

Z. Yu et al., "GaAs-based heterostructures on Silicon," 2005 Int'l Conf. on Compund Semiconductor Mfg New Orleans, LA (Apr. 11-14, 2005).

M.A. Lourenco et al., "Ion beam fabricated silicon light emitting diodes," Phys. Stat. Sol. (a), vol. 201, No. 2 pp. 239-244 (2004).

Maria Eloisa Castagna et al., "High efficiency light emitting devices in silicon," Materials Science & Engineering B, vol. 105, Elsevier, pp. 83-90 (2003).

Regina Ragan et al., "Direct energy gap group IV semiconductor alloys and quantum dot arrays in SnxGe1-x/Ge and SnxSi1-x/Si alloy systems," Materials Science & Engineering B, vol. 87, Elsevier, pp. 204-213 (2001).

T. Brunhes et al., "Electroluminescence of Ge/Si self-assembled quantum dots grown by chemical vapor deposition," Applied Physics Letters, vol. 77, No. 12, pp. 1822-1824 (Sep. 18, 2000).

Philippe M. Fauchet et al., "Progress toward nanoscale silicon light emitters," IEEE J. of Selected Topics in Quantum Electronics, vol. 4, No. 6, pp. 1020-1028 (Nov.-Dec. 1998).

C. S. Peng et al., "Optical properties of Ge self-organized quantum dots in Si," Phys. Rev. B. vol. 57, No. 15, pp. 8805-8808 (1998).

G.T. Reed et al., "Erbium-doped silicon and porous silicon for optoelectronics," Materials Science & Engineering B, vol. 40, pp. 207-215 (1996).

* cited by examiner

LIGHT-EMITTING GROUP IV SEMICONDUCTOR DEVICES

BACKGROUND

Group IV semiconductors, such as silicon, germanium, and their alloys, have indirect energy bandgaps, which inhibit band-to-band radiative recombination of electrons and holes. As a result, the predominant recombination mechanism for holes and electrons in these types of semiconductors typically is non-radiative recombination at, for example, defect sites in bulk regions and at surfaces. For this reason, most devices that are formed of these types of semiconductors are inefficient emitters of light.

Silicon is the semiconductor of choice for fabricating electronic devices. It is inexpensive to work with and has a native oxide that provides superior performance and readily may be incorporated in electronic devices wherever it is needed. The significant advantages of using silicon to fabricate electronic devices have spurred many efforts to integrate light emitting devices with silicon electronics.

One favored approach for integrating light emitting devices with silicon involves forming light-emitting devices from direct bandgap compound semiconductors that are grown on silicon substrates. This approach, however, is not compatible with most silicon device fabrication processes (e.g., CMOS fabrication processes) due to the different thermal requirements of these processes and the processes that are used to fabricate compound semiconductor devices. This approach also may be cost-prohibitive.

Other approaches for integrating light emitting devices with silicon have focused on improving the emission efficiency of silicon. Among the approaches that have shown some promise in this regard are: use of silicon nanostructures, such as porous silicon, to form electroluminescent devices; use of silicon doped with rare-earth metals, such as erbium and cerium, which exhibit luminescent transitions in silicon and porous silicon; use of dislocations that increase the silicon bandgap by introducing local tensile strain to prevent electrons from reaching non-radiative defect sites; and the incorporation of erbium-doped silicon nanocrystals into a silicon dioxide matrix to achieve radiative recombination of carriers with reduced problems of thermal quenching, which is typical of erbium-doping in bulk silicon.

The above-described approaches have demonstrated some success in generating light from silicon devices. The light-emission efficiencies achieved by these approaches, however, are insufficient to displace compound semiconductors in optoelectronics applications. Thus, despite being the semiconductor of choice for fabricating electronic devices, silicon has yet to be incorporated effectively into optoelectronics applications.

SUMMARY

In accordance with the invention, Group IV semiconductor devices in which both electrons and holes are confined in an accumulation region and away from non-radiative recombination defect sites, such as surface states and bulk defects are featured. The radiative recombination efficiency of the constituent Group IV semiconductors in devices, such as light emitting diodes is improved. The improved carrier confinement that is achieved in accordance with the invention also allows the lasing current density threshold in Group IV semiconductor lasers to be reduced to practical levels by allowing carriers to be confined to relatively small volumes. The improved carrier confinement also reduces carrier diffusion into adjacent devices and circuitry that otherwise would cause cross talk and interference problems.

DETAILED DESCRIPTION

Figure 1:
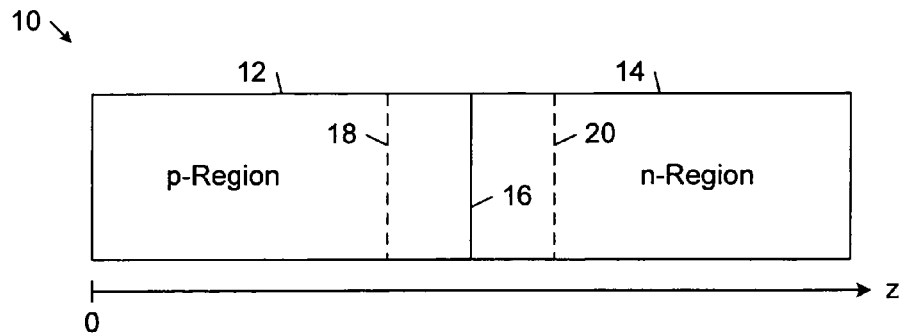
FIG. 1 is a diagrammatic view of an embodiment of a semiconductor device in accordance with the invention.

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

FIG. 1 shows an embodiment in accordance with the invention of a semiconductor device 10 that includes a p-region 12 and an n-region 14, which are separated by a metallurgical junction 16. The p-region 12 is formed of a first Group IV semiconductor that is doped with a p-type dopant (i.e., acceptors) and the n-region is formed of a second Group IV semiconductor that is doped with an n-type dopant (i.e., donors). At the metallurgical junction 16 the concentration of acceptors is the same as the concentration of donors.

The first and second Group IV semiconductors may be the same or they may be different. The compositions of the first and second Group IV semiconductors may be elemental semiconductors or they may be compound semiconductors. Each of the first and second Group IV semiconductors typically includes at least one of silicon and germanium. In exemplary embodiments, each of the first and second Group IV semiconductors is one of Si, Ge, SiGe, $C_xSi_{1-x}$, $Sn_xGe_{1-x}$, $Sn_xSi_{1-x}$, $(C_xGe_{1-x})_ySi_{1-y}$, and $(C_xSn_{1-x})_ySi_{1-y}$, where $0<x, y<1$.

Figure 2:
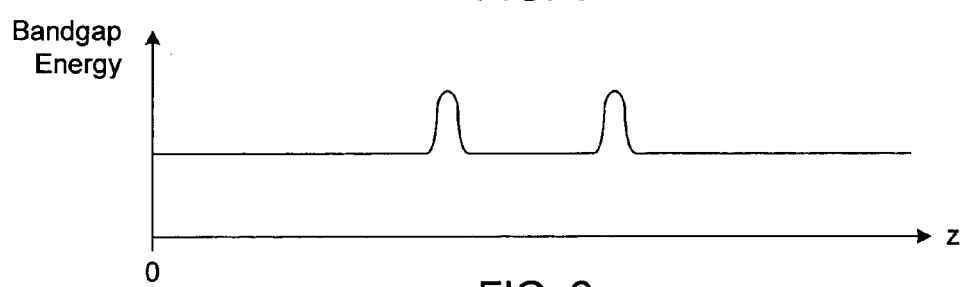
FIG. 2 is a graph of bandgap energy plotted as a function of position across the semiconductor device in accordance with the invention shown in FIG. 1.

The first and second Group IV semiconductors have respective bandgaps corresponding to forbidden energy levels separating the valence band ($E_V$) and the conduction band ($E_C$). The p-region 12 includes a first region 18 of local crystal modifications (LCM) that introduces localized strain that increases the bandgap of the first Group IV semiconductor. The n-region 14 includes a second region 20 of local crystal modifications introducing localized strain that increases the bandgap of the second Group IV semiconductor. In some embodiments in accordance with the invention, the local crystal modifications correspond to strain-inducing defects (e.g., dislocation loops, interstitial clusters, or rod-like defects), or a layer of epitaxial material inducing strain in the corresponding Group IV semiconductor. An example of the bandgap-increasing effects of the first region 18 of local crystal modifications and the second region 20 of local crystal modifications are shown by the peaks in the bandgap energy graph shown in FIG. 2.

Figure 3:
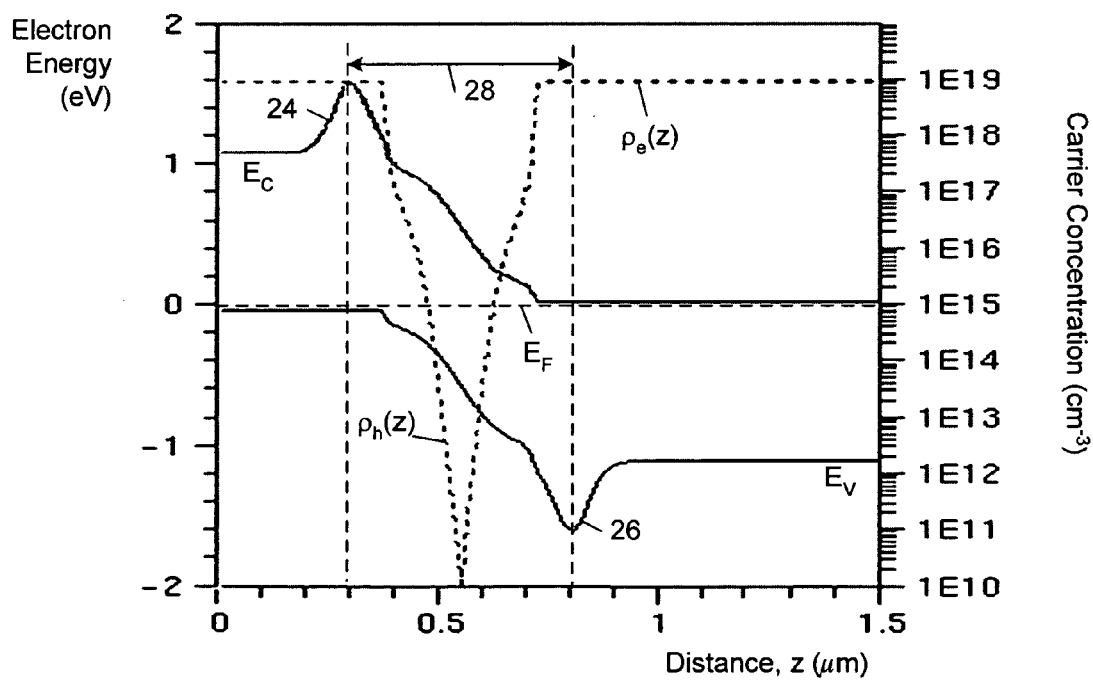
FIG. 3 shows graphs of electron energy and carrier concentration plotted as a function of vertical position through an embodiment of the semiconductor device in accordance with the invention shown in FIG. 1 in thermal equilibrium.
Figure 4:
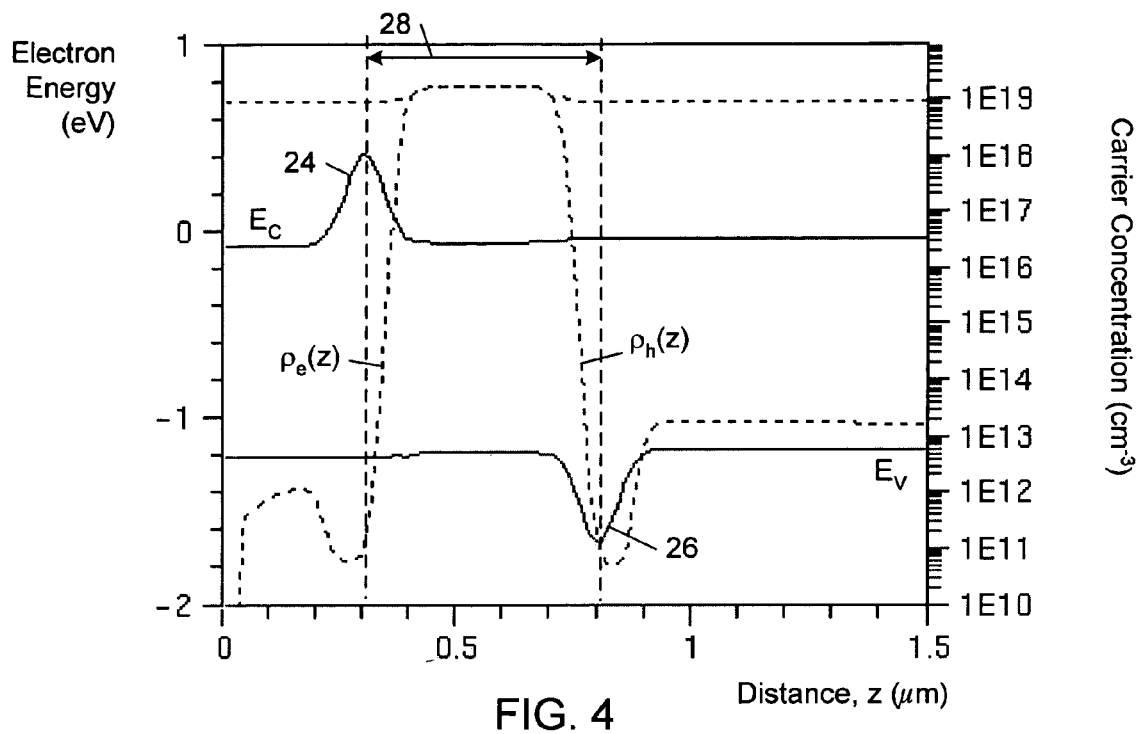
FIG. 4 shows graphs of electron energy and carrier concentration plotted as a function of vertical position through the semiconductor device embodiment in accordance with the invention of FIG. 3 under forward bias.

FIGS. 3 and 4 show a calculated energy band diagram for an embodiment in accordance with the invention of the semiconductor device 10 in thermal equilibrium and under forward bias, respectively. In the p-region 12, the first region 18 of local crystal modifications creates an energy barrier 24 in the conduction band. In the n-region 14, the second region 20 of local crystal modifications creates an energy barrier 26 in the valence band. The region 28 between the energy barriers 24, 26 is referred to herein as a "charge accumulation region". As shown in FIG. 3, the charge accumulation region 28 is largely depleted in thermal equilibrium as a result of drift and diffusion of holes and electrons between the p-region 12 and the n-region 14. In addition, the p-region 12 and the n-region 14 are moderately to heavily doped (e.g., with dopant concentrations of at least $1 \times 10^{18}$ cm$^{-3}$) at least in the vicinity of the first and second LCM regions 18, 20. This feature ensures that the majority of the bandgap increases that are induced by the first and second LCM regions 18, 20 are apportioned to the conduction band and the valence band, respectively. This feature also increases the efficiency of the semiconductor device 10 by reducing voltage losses across the energy barriers 24, 26.

Figure 5:
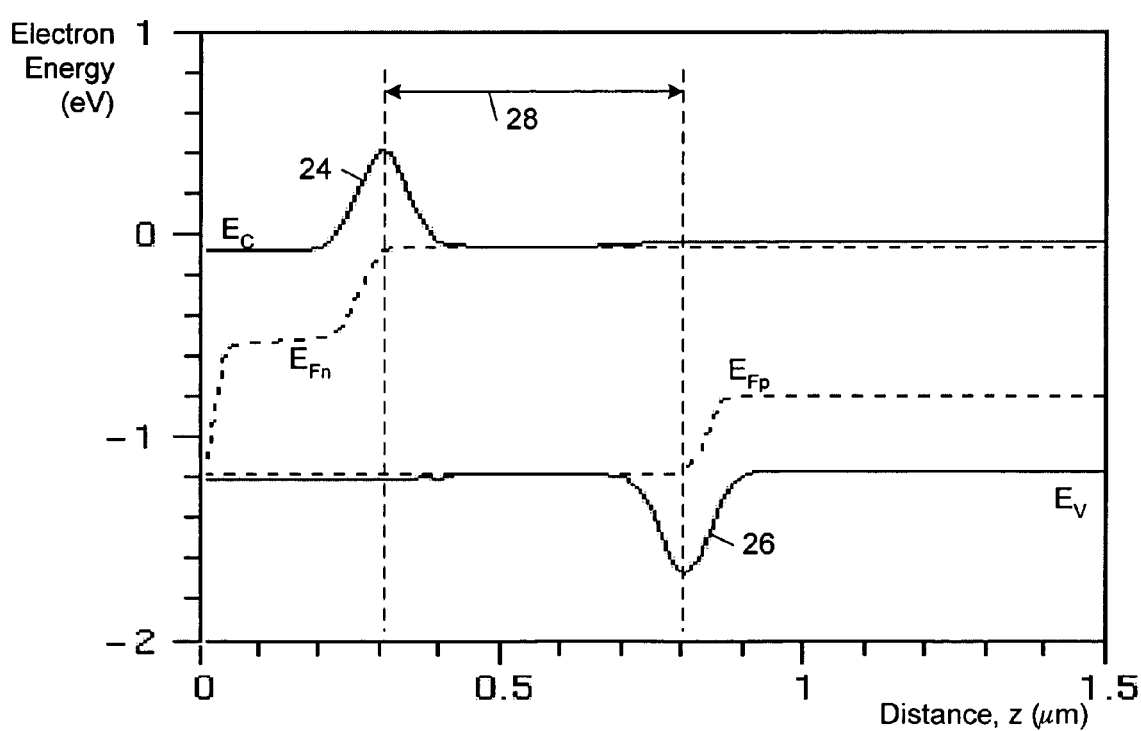
FIG. 5 is a graph of electron energy plotted as a function of position across the semiconductor device in accordance with the invention of FIG. 3 under forward bias.

FIG. 5 shows an energy band diagram for the semiconductor device 10 under forward bias (i.e., a positive voltage is applied to the p-region 12 relative to the n-region 14). The applied voltage reduces the electrostatic potential across the charge accumulation region 28 and splits the hole and electron quasi-Fermi levels ($E_{Fp}$ and $E_{Fn}$). The applied voltage reduces the drift current relative to the diffusion current and enhances the hole diffusion from the p-region 12 and enhances the electron diffusion from the n-region 14. As a result, holes are injected into the charge accumulation region 28 from the p-region 12 and electrons are injected into the charge accumulation region 28 from the n-region 14. This leads to increases in the hole concentration ($\rho_h(z)$) and the electron concentration ($\rho_e(z)$) in the charge accumulation region 28, as shown in FIG. 5.

The energy barriers 24, 26 spatially confine the injected carriers in the charge accumulation region 28. In particular, the valence band energy barrier 24 restricts the transport of electrons from the accumulation region 28 across the p-region 12 and the conduction band energy barrier 26 restricts the transport of holes from the accumulation region 28 across the n-region 14. The first region 18 of local crystal modifications and the second region 20 of local crystal modifications are able to spatially confine the injected carriers in the charge accumulation region 28. The distance separating the first and second LCM regions 18, 20 typically is at least 50 nm (nanometers). In some embodiments, the distance separating the first and second LCM regions 18, 20 ranges from 50 nm to 20 μm (micrometers). In one exemplary embodiment, each of the first region 18 of local crystal modifications and the second region 20 of local crystal modifications is located approximately 100 nm from respective edges of the depletion region in thermal equilibrium.

By spatially confining the injected carriers in the charge accumulation region 28, the energy barriers 24, 26 reduce the diffusion of injected holes and electrons to non-radiative recombination sites outside of the charge accumulation region 28. This increases the radiative-transition probability in the charge accumulation region 28 and thereby increases the amount of light that is generated from the radiative recombination of electrons and holes in the charge accumulation region 28. As a result, the energy barriers 24, 26 improve the light emission efficiency of the semiconductor device 10 and reduce the diffusion of carriers to neighboring devices. The energy barriers 24, 26 also enable the carriers to be confined to a small volume, which allows the current density threshold for lasing to be reduced to practical levels.

Figure 6:
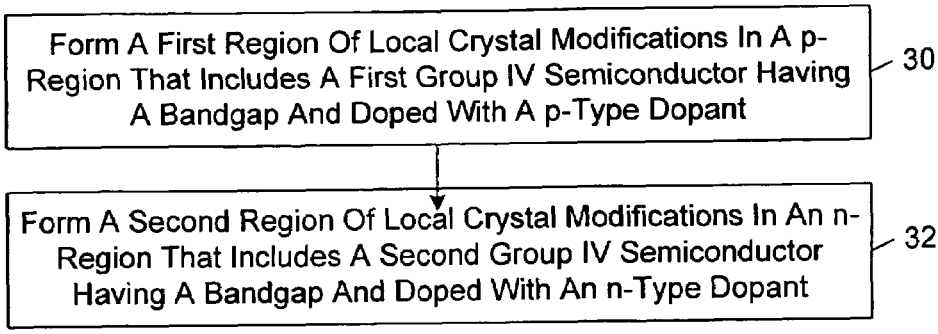
FIG. 6 is a flow diagram of an embodiment in accordance with the invention of a method of fabricating the semiconductor device shown in FIG. 1.

FIG. 6 shows an embodiment of a method of fabricating the semiconductor device 10. In accordance with this method, a first region of local crystal modifications is formed in a p-region that includes a first Group IV semiconductor that has a bandgap and is doped with a p-type dopant (block 30). A second region of local crystal modifications is formed in an n-region that includes a second Group IV semiconductor that has a bandgap and is doped with an n-type dopant (block 32).

In general, the first region 18 of local crystal modifications and the second region 20 of local crystal modifications may include any type of structures or materials that causes a local modification to the crystal structure that introduces strain that increases the bandgap of the Group IV semiconductors in which they are incorporated. In some embodiments in accordance with the invention, the first and second LCM regions 18, 20 include the same type of strain-inducing structure/material. In other embodiments in accordance with the invention, the first and second LCM regions 18, 20 include different types of strain-inducing structures/materials. In some embodiments in accordance with the invention, one or both of the first and second regions 18, 20 may include strain-inducing defects (e.g., dislocation loops, interstitial clusters, or rod-like defects) or a layer of epitaxial material inducing strain in the corresponding Group IV semiconductor.

Figure 7:
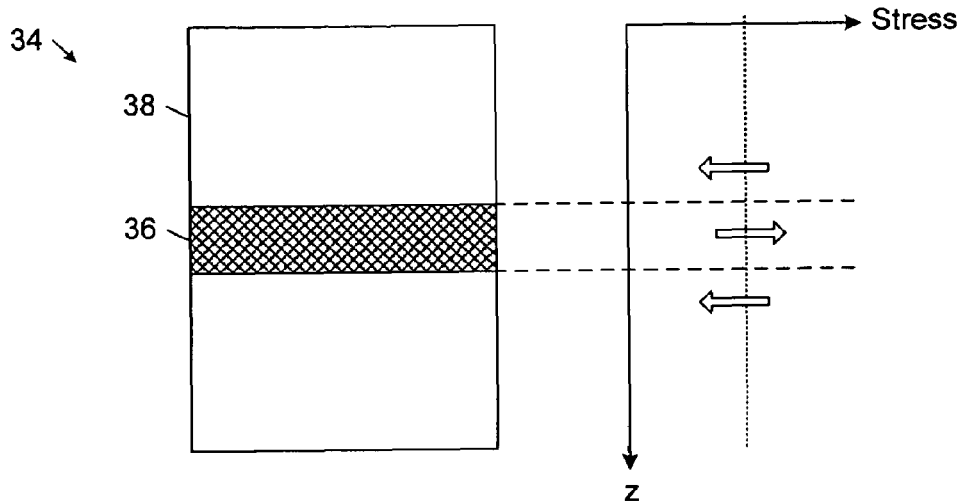
FIG. 7 is a diagrammatic view of a region of local crystal modifications in the semiconductor device in accordance with the invention shown in FIG. 1 and a diagrammatic graph of stress plotted as a function of position across the region of local crystal modifications.

FIG. 7 shows a region 34 in an exemplary embodiment in accordance with the invention of the semiconductor device 10 that includes a LCM region 36 (e.g., one of the first and second LCM regions 18, 20). FIG. 7 also shows a diagrammatic graph of stress plotted as a function of position through the LCM region 34. The LCM region 36 is incorporated or embedded in a Group IV semiconductor 38. In general, the bandgap energies of Group IV semiconductors vary with changes in stress. In some embodiments in accordance with the invention (e.g., when the semiconductor 38 is silicon), the bandgap energy of the Group IV semiconductor increases with a decrease in stress (i.e., negative pressure). In these embodiments in accordance with the invention, the LCM region 36 is designed to increase tensile stress in regions of the Group IV semiconductor adjacent to the LCM region 36, as shown in FIG. 7. This increase in tensile stress increases the bandgap energy of localized regions of the Group IV semiconductor 38 adjacent to the LCM region 36. In other embodiments in accordance with the invention, (e.g., when the semiconductor 38 is germanium), the bandgap energy of the Group IV semiconductor increases with an increase in stress (i.e., positive pressure). In these embodiments in accordance with the invention, the LCM region 36 is designed to increase stress in regions of the Group IV semiconductor adjacent to the LCM region 36. This increase in stress increases the bandgap energy of these localized regions of the Group IV semiconductor 38.

Figure 8:
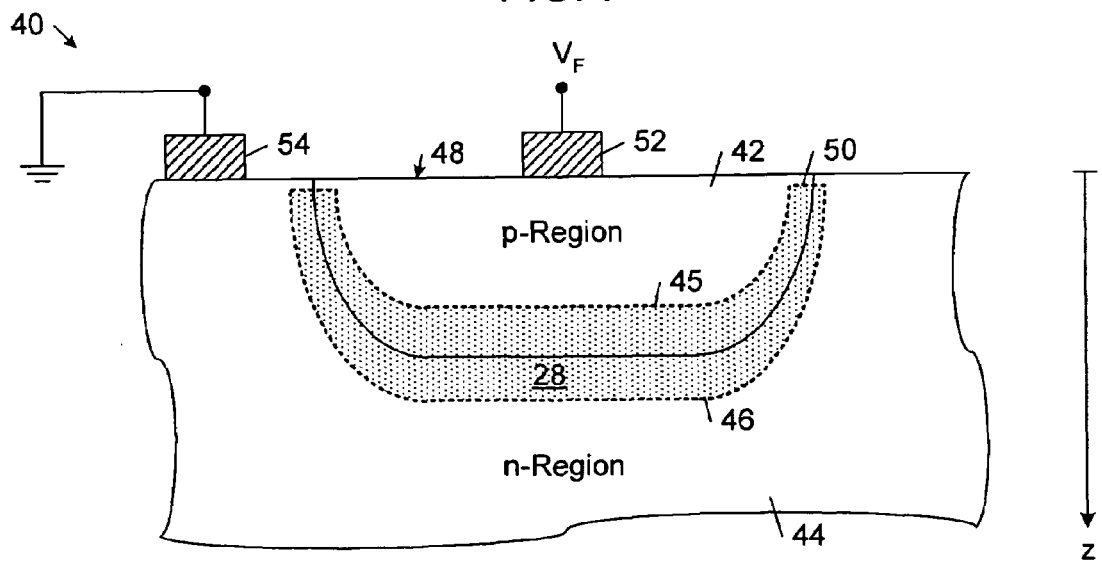
FIG. 8 is a diagrammatic sectional view of a first embodiment of the semiconductor device embodiment in accordance with the invention shown in FIG. 1.
Figure 9:
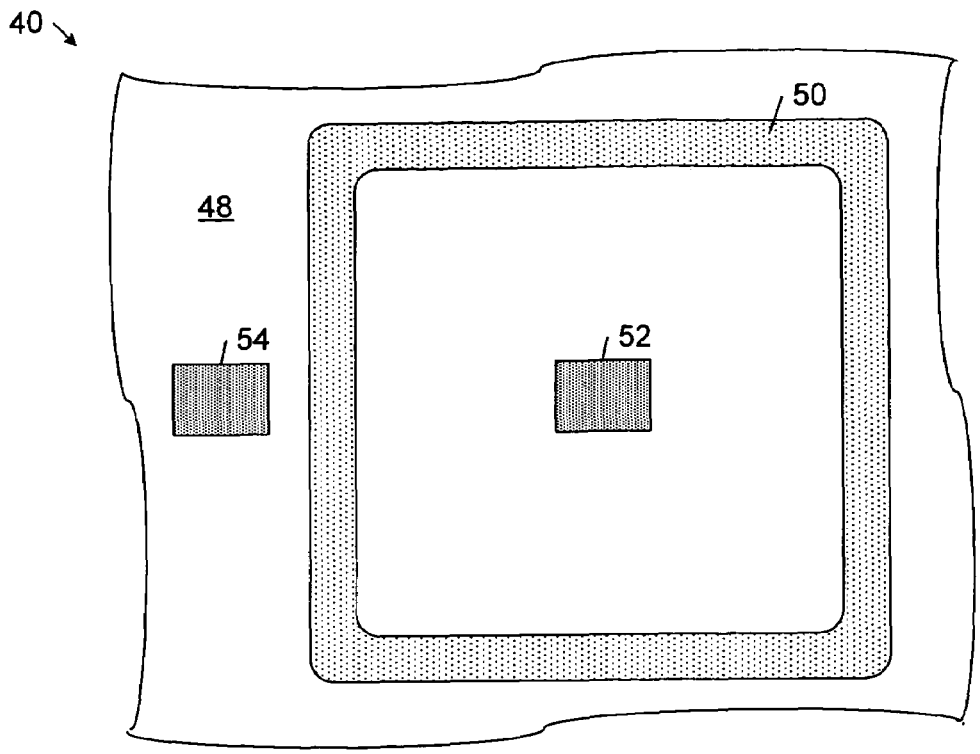
FIG. 9 is a diagrammatic top view of the semiconductor device embodiment in accordance with the invention shown in FIG. 8.

FIGS. 8 and 9 respectively show a sectional view and a top view of a semiconductor device 40 that corresponds to a first implementation of the semiconductor device 10. The semiconductor device 40 includes a p-region 42 and an n-region 44. The p-region 42 includes a first region 45 of local crystal modifications. The n-region 44 includes a second region 46 of local crystal modifications.

The semiconductor device 40 additionally includes a top surface 48 and a third region 50 of local crystal modification near the top surface 48. In the illustrated embodiment, the third region 50 creates an energy band barrier against transport of injected charge carriers from the charge accumulation region 28. In this way, the third region 50 reduces the diffusion of injected holes and electrons to non-radiative recombination sites at the top surface 48 and other nearby nonradiative recombination sites. The first, second, and third regions 45, 46, 50 of local crystal modifications collectively surround the charge accumulation region 28 to spatially confine the injected carriers in the charge accumulation region 28. In this way, these embodiments increase the efficiency of light emission and reduce carrier diffusion from the charge accumulation region 28 and into adjacent devices and circuitry. These embodiments also enable the carriers to be confined in a small volume, which is important for lowering the current density threshold for lasing.

The semiconductor device 40 also includes a pair of ohmic electrical contacts 52, 54 on the top surface 48. In the illustrated embodiment, the electrical contact 52 connects the p-region 42 to a source of a forward bias (VF) and the electrical contact 54 connects the n-region to ground potential. In response to an applied forward bias, electrons and holes are injected into the accumulation region 28 where they are confined by the first, second, and third regions 45, 46, 50 of local crystal modifications. The injected carriers recombine in the charge accumulation region 28. The light that is generated by the recombining holes and electrons may be emitted, for example, through the top 48 or through a bottom surface of the semiconductor device 40.

Figure 10:
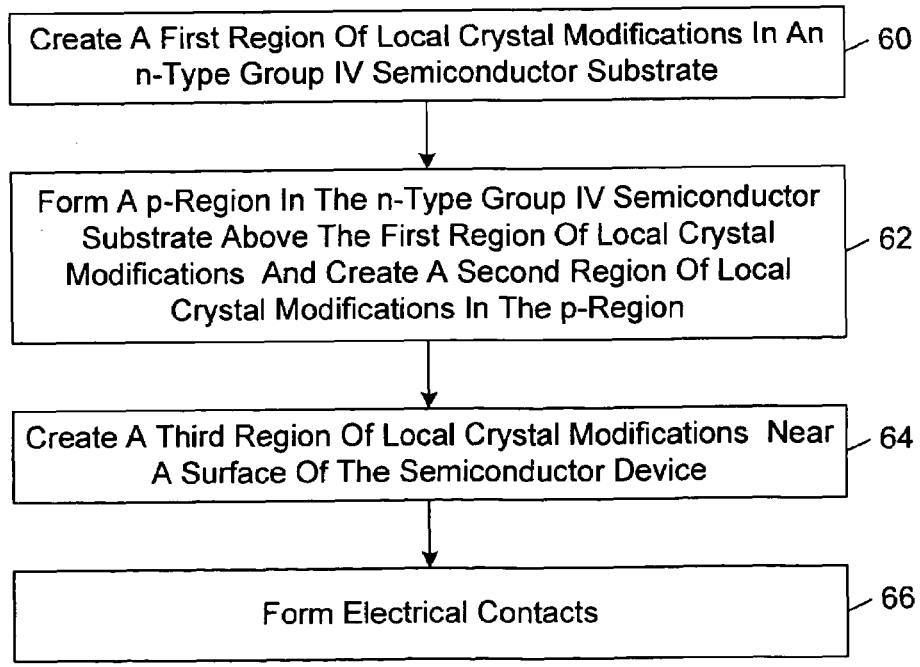
FIG. 10 is a flow diagram of an embodiment of a method of fabricating the semiconductor device embodiment in accordance with the invention shown in FIG. 8.

FIG. 10 shows an embodiment of a method of fabricating the semiconductor device 40. In this embodiment, regions of local crystal modifications are formed using ion implantation and annealing.

Figure 11:
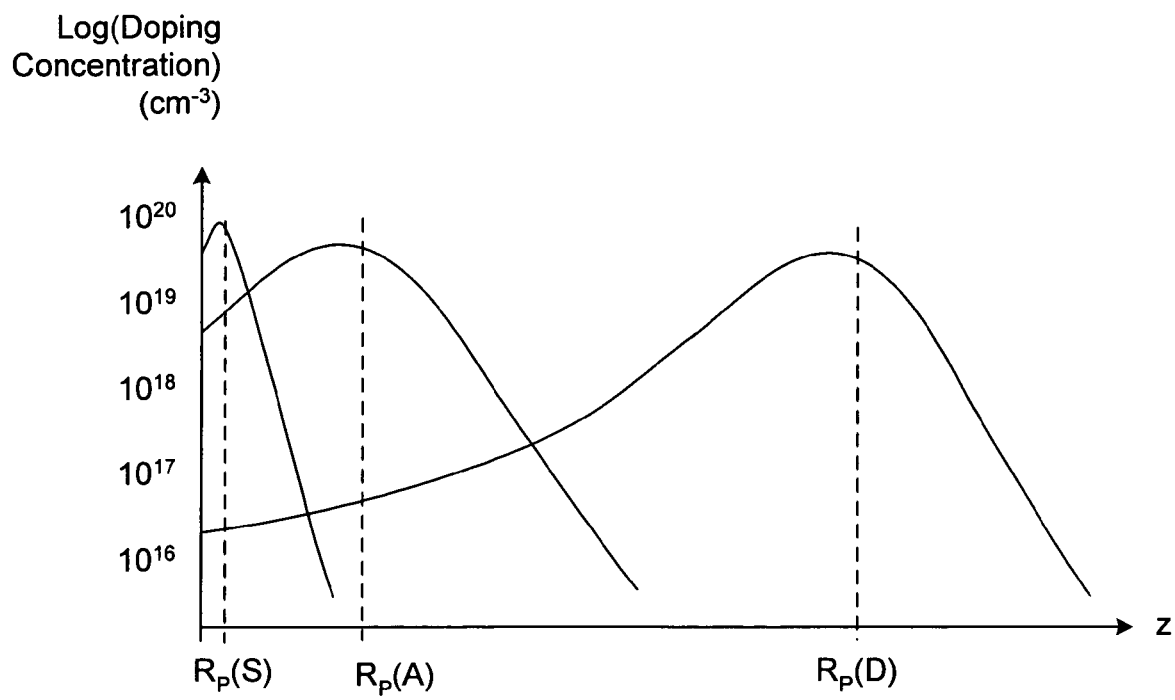
FIG. 11 is an exemplary graph of doping concentration plotted as a function of position through embodiments in accordance with the invention of the semiconductor device shown in FIG. 1.

In accordance with this embodiment, a first region of local crystal modifications is created in an n-type Group IV semiconductor substrate (block 60). The first region may be created by implanting one or more atomic species in the n-type Group IV semiconductor substrate and annealing the implanted Group IV semiconductor substrate to activate the implanted atomic species and aggregate excess interstitial Group IV semiconductor atoms. The implanted atomic species may be an n-type dopant. In some implementations, the atomic species may include one or more elements from Group IV of the periodic table (e.g. C, Si, Ge, and Sn). The implantation dose and energy are selected to achieve a target peak dopant concentration that is at least $1 \times 10^{18}$ cm$^{-3}$ at a target projected range ($R_p(D)$; see FIG. 11). In some implementations, the target projected range $R_p(D)$ is approximately 100 nm below the bottom edge of the depletion region in thermal equilibrium. The implantation is followed by a post-implant anneal that aggregates interstitial atoms to create strain-inducing defects (e.g., dislocation loops, interstitial clusters, or rod-like defects).

After the first region of local crystal modifications is formed (block 60), a p-type region is formed in the n-type Group IV semiconductor substrate above the first region of local crystal modifications and a second region of local crystal modifications is created in the p-region (block 62). The p-region and the second region of local crystal modifications may be formed using the same process or using separate processes.

In some implementations, the p-region and the second region of local crystal modifications are formed using the same process. In these implementations, the n-type Group IV semiconductor substrate is implanted with a p-type dopant (e.g., boron). The implantation dose and energy are selected to achieve a target peak dopant concentration that is at least $1 \times 10^{18}$ cm$^{-3}$ at a target projected range ($R_p(A)$; see FIG. 11). In some implementations, the target projected range $R_p(A)$ is approximately 100 nm above the top edge of the depletion region in thermal equilibrium. The implantation is followed by a post-implant anneal that aggregates interstitial atoms to create strain-inducing defects (e.g., dislocation loops, interstitial clusters, or rod-like defects).

In other implementations, the p-region and the second region of local crystal modifications are formed using separate processes. In these implementations, the n-type Group IV semiconductor substrate is implanted with a p-type dopant (e.g., boron) to achieve a target doping concentration that is at least $10^{18}$ cm$^{-3}$ at the target projected range $R_p(A)$. After the p-region is formed, the p-region is implanted with an atomic species that includes one or more elements from Group IV of the periodic table (e.g. C, Si, Ge, and Sn). The atomic species is implanted at a moderate to high dose (e.g., up to about $10^{16}$ cm$^{-2}$) at the target projected range $R_p(A)$. The implantation is followed by a post-implant anneal that aggregates interstitial atoms to create strain-inducing defects (e.g., dislocation loops, interstitial clusters, or rod-like defects).

After the second region of local crystal modifications is formed (block 62), a third region of local crystal modifications is formed near a surface of the semiconductor device 40 (block 64). In some implementations, the third region of local crystal modifications is formed by implanting an atomic species that includes one or more elements from Group IV of the periodic table (e.g. C, Si, Ge, and Sn). The atomic species is implanted at a moderate to high dose (e.g., up to about $10^{16}$ cm$^{-2}$) at a shallow target projected range ($R_p(S)$; see FIG. 11). The implantation is followed by a post-implant anneal that aggregates interstitial atoms to create strain-inducing defects (e.g., dislocation loops, interstitial clusters, or rod-like defects).

After the third region of local crystal modifications is formed (block 64), ohmic electrical contacts are formed (block 66). The electrical contacts may be formed using any one of a wide variety of different processes for forming ohmic electrical contacts.

In the above-described process, each implantation is followed by a post-implant anneal. In other embodiments, the device structure is not annealed until after the last implant.

EXAMPLE 1

In one exemplary implementation of the method shown in FIG. 10, the semiconductor device 40 is formed in an n-well that is formed in a silicon substrate. In this implementation, the n-well is doped with n-type dopant at a peak concentration of at least $1\times10^{18}$ cm$^{-3}$. The second region 46 of local crystal modifications is formed (block 60) by implanting silicon in the n-well at a moderate to high dose (e.g., on up to about $5\times10^{15}$ cm$^{-2}$) to achieve a target peak dopant concentration that is at least $1\times10^{18}$ cm$^{-3}$ at the target projected range $R_p(D)$. The implantation is followed by a post-implant anneal at 800-1100° C. for up to one hour in an inert ambient.

The p-region 42 and the first region 45 of local crystal modifications are formed (block 62) by implanting a p-type dopant (e.g., boron) in the n-well. The implantation dose and energy are selected to achieve a target peak dopant concentration that is at least $1\times10^{18}$ cm$^{-3}$ at the target projected range $R_p(A)$. The implantation is followed by a post-implant anneal at 800-1100° C. for up to one hour in an inert ambient.

The third region 50 of local crystal modifications is formed (block 64) by implanting silicon across the metallurgical junction between the p-region and the n-well near the top surface 48 of the semiconductor device 40. The silicon is implanted at a moderate to high dose (e.g., up to about $5\times10^{15}$ cm$^{-2}$) at the shallow target projected range $R_p(S)$. The implantation is followed by a post-implant anneal at 800-1100° C. for up to one hour in an inert ambient.

The ohmic contacts 52, 54 are formed on the top surface of the semiconductor device 40 (block 66).

Figure 12:
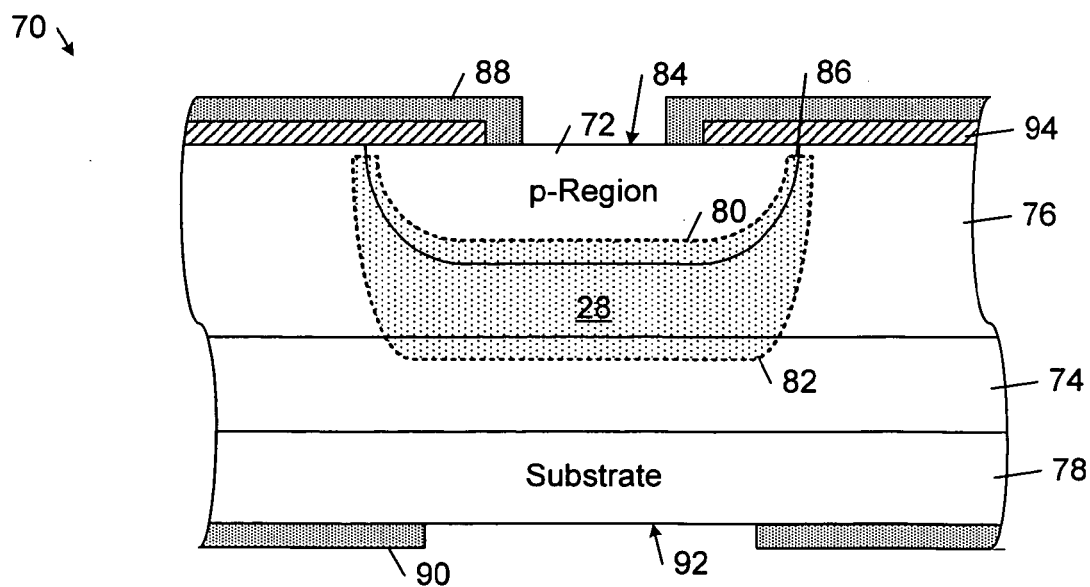
FIG. 12 is a diagrammatic sectional view of a second embodiment in accordance with the invention of the semiconductor device shown in FIG. 1.

FIG. 12 shows a sectional view of a semiconductor device 70 that corresponds to a second embodiment in accordance with the invention of the semiconductor device 10. The semiconductor device 70 includes a p-region 72, an n-region 74, and an intermediate region 76. The n-region corresponds to an n-type epitaxial layer that is grown on a Group IV semiconductor substrate 78. As used herein, the term "epitaxial layer" refers to a semiconductor layer having the same crystalline orientation as the substrate on which it is grown. The intermediate region 76 corresponds to an undoped or lightly doped epitaxial Group IV semiconductor layer that is grown on the n-type epitaxial layer. The p-region 72 corresponds to a volume of the intermediate region 76 that is doped p-type. The semiconductor device 70 additionally includes a first region 80 of local crystal modifications in the p-region 72, and a second region 82 of local crystal modifications in the n-region 74 and in the intermediate region 76.

The semiconductor device 70 includes a top surface 84 and a third region 86 of local crystal modifications near the top surface 84. The third LCM region 86 creates an energy band barrier against transport of injected charge carriers from the charge accumulation region 28. In this way, the third LCM region 86 reduces the diffusion of injected holes and electrons to non-radiative recombination sites at the top surface 84 and other nearby nonradiative recombination sites. This increases the radiative transition probability in the device 70 and thereby increases the efficiency of charge carriers to recombine and generate light in the device 70. The first, second, and third LCM regions 80, 82, and 86 collectively surround the charge accumulation region 28 to spatially confine the injected carriers in the charge accumulation region 28. The first, second, and third LCM regions 80, 82, and 86 increase the efficiency of light emission, reduce diffusion of carriers from the charge accumulation region and into adjacent devices and circuits. The first, second, and third LCM regions 80, 82, and 86 also enable the carriers to be confined in a small volume, which is important for lowering the current density threshold for lasing.

The semiconductor device 70 also includes a top ohmic electrical contact 88 on the top surface 84 and a bottom ohmic electrical contact 90 on a bottom surface 92 of the substrate 78. The top electrical contact 88 is electrically isolated from the intermediate region 76 by a layer 94 of electrically insulating material (e.g., silicon dioxide or silicon nitride). The electrical contact 88 may connect the p-region 72 to a source of a forward bias and the electrical contact 90 may connect the n-region to ground potential. In response to an applied forward bias, electrons and holes are injected into the accumulation region 28 where they are confined by the first, second, and third regions 80, 82, 86 of local crystal modifications. The injected carriers recombine in the charge accumulation region 28. The light that is generated by the recombining holes and electrons may be emitted, for example, through the top surface 84 or the bottom surface 92.

Figure 13:
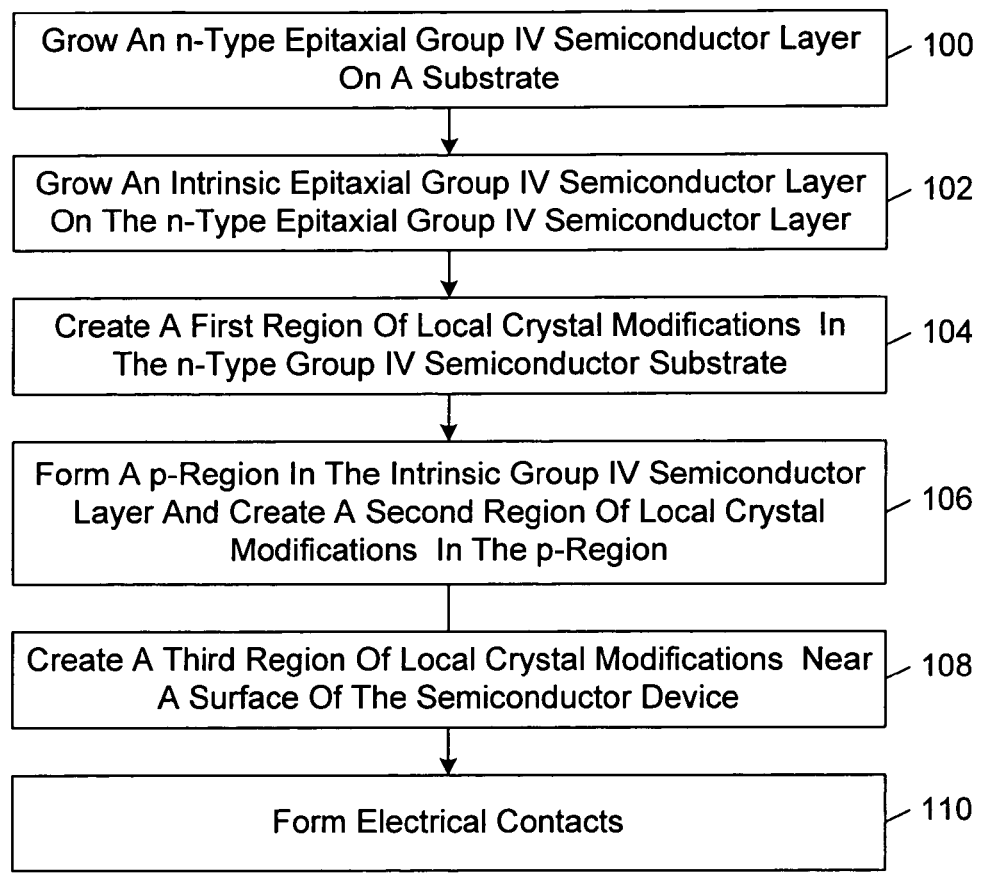
FIG. 13 is a flow diagram of an embodiment in accordance with the invention of a method of fabricating the semiconductor device shown in FIG. 12.

FIG. 13 shows an embodiment in accordance with the invention of a method of fabricating the semiconductor device 70. In this embodiment, regions of local-crystal modifications are formed using ion implantation and annealing.

In accordance with this embodiment, an n-type epitaxial Group IV semiconductor layer is grown on a substrate (block 100). In general, the substrate may be formed of any type of material that supports epitaxial growth of the n-type epitaxial Group IV semiconductor layer. The substrate may be, for example, a Group IV semiconductor substrate. In some implementations, the epitaxial Group IV semiconductor layer is doped with an n-type dopant at a concentration level of at least $1\times10^{18}$ cm$^{-3}$.

An intrinsic (i.e., undoped) epitaxial Group IV semiconductor layer is grown on the n-type epitaxial Group IV semiconductor layer (block 102). In general, the intrinsic Group IV semiconductor layer may be formed of any Group IV semiconductor that is capable of being grown epitaxially on the underlying n-type epitaxial Group IV semiconductor layer. In some embodiments in accordance with the invention, the intrinsic Group IV semiconductor and the n-type epitaxial layer have identical compositions.

After the intrinsic epitaxial Group IV semiconductor layer is grown (block 102), a first region of local crystal modifications is formed in the n-type epitaxial Group IV semiconductor layer (block 104). The first region of local crystal modifications may be formed by implanting one or more atomic species in the n-type epitaxial Group semiconductor layer and annealing the implanted epitaxial Group IV semiconductor layer to activate the implanted atomic species and aggregate excess interstitial Group IV semiconductor atoms. The implanted atomic species may be an n-type dopant. Alternatively, the atomic species may include one or more elements from Group IV of the periodic table (e.g., C, Si, Ge, and Sn). The implantation dose and energy are selected to achieve a target peak dopant concentration that is at least $1 \times 10^{18}$ cm$^{-3}$ at the target projected range $R_p(D)$. The implantation is followed by a post-implant anneal that aggregates interstitial atoms to create strain-inducing defects (e.g., dislocation loops, interstitial clusters, or rod-like defects).

After the first region of local crystal modifications is formed (block 104), a p-type region is formed in the intrinsic epitaxial Group IV semiconductor layer and a second region of local crystal modifications is created in the p-region (block 106). The p-region and the second region of local crystal modifications may be formed using the same process or using separate processes.

In some embodiments in accordance with the invention, the p-region and the second region of local crystal modifications are formed using the same process. In these embodiments, the intrinsic epitaxial Group IV semiconductor layer is implanted with a p-type dopant (e.g., boron). The implantation dose and energy are selected to achieve a target peak dopant concentration that is at least $1 \times 10^{18}$ cm$^{-3}$ at the target projected range $R_p(A)$. The implantation is followed by a post-implant anneal that aggregates interstitial atoms to create strain-inducing defects (e.g., dislocation loops, interstitial clusters, or rod-like defects).

In other embodiments in accordance with the invention, the p-region and the second region of local crystal modifications are formed using separate processes. In these embodiments, the intrinsic epitaxial Group IV semiconductor layer is doped with a p-type dopant (e.g., boron) to achieve a target doping p-type dopant concentration that is at least $1 \times 10^{18}$ cm$^{-3}$ at the target projected range $R_p(A)$.

After the p-region is formed, the p-region is implanted with an atomic species that includes one or more elements from Group IV of the periodic table. The atomic species is implanted at a moderate to high dose (e.g., up to about $10^{16}$ cm$^{-2}$) at the target projected range. The implantation is followed by a post-implant anneal. After the second region of local crystal modifications is formed (block 106), a third region of local crystal modifications is formed near a surface of the semiconductor device 70 (block 108). In some embodiments in accordance with the invention, the third region of local crystal modifications is formed by implanting an atomic species that includes one or more elements from Group IV of the periodic table. The atomic species is implanted at a moderate to high dose (e.g., up to about $10^{16}$ cm$^{-2}$) at the shallow target projected range $R_p(S)$. The implantation is followed by a post-implant anneal that aggregates interstitial atoms to create strain-inducing defects (e.g., dislocation loops, interstitial clusters, or rod-like defects).

After the third region of local crystal modifications is formed (block 108), the ohmic electrical contacts 88, 90 are formed (block 110). The electrical contacts 88, 90 may be formed using any one of a wide variety of different processes for forming ohmic electrical contacts.

In the above-described process, each implantation is followed by a post-implant anneal. In other embodiments in accordance with the invention, the device structure is not annealed until after the last implant.

EXAMPLE 2

In one exemplary embodiment in accordance with the invention of the method shown in FIG. 13, the semiconductor device 70 is formed on a silicon substrate.

The n-type epitaxial layer 74 is formed (block 100) by growing a layer of n-type epitaxial silicon on the substrate 78 or on an epitaxial buffer layer. In this embodiment in accordance with the invention, the n-type epitaxial layer 74 is doped with an n-type dopant at a concentration of at least $1 \times 10^{18}$ cm$^{-3}$.

The intrinsic epitaxial layer 76 is formed (block 102) by growing a layer of undoped epitaxial silicon on the n-type epitaxial silicon layer 74.

The second region 82 of local crystal modifications is formed (block 104) by implanting silicon in the n-type epitaxial silicon layer with a target peak dopant concentration that is at least $1 \times 10^{18}$ cm$^{-3}$ at the target projected range $R_p(D)$. The silicon is implanted at a moderate to high dose (e.g., up to about $5 \times 10^{15}$ cm$^{-2}$). The implantation is followed by a post-implant anneal at 800-1100° C. for up to one hour in an inert ambient.

The p-region 72 and the first region 80 of local crystal modifications are formed (block 106) by implanting a p-type dopant (e.g., boron) in the intrinsic epitaxial silicon layer 76. The implantation dose and energy are selected to achieve a target peak dopant concentration that is at least $1 \times 10^{18}$ cm$^{-3}$ at the target projected range $R_p(A)$. The implantation is followed by a post-implant anneal at 800-1100° C. for up to one hour in an inert ambient.

The third region 86 of local crystal modifications is formed (block 108) by implanting silicon across the metallurgical junction between the p-region 72 and the intrinsic epitaxial silicon layer 76 near the top surface 84 of the semiconductor device 70. The silicon is implanted at a moderate to high dose (e.g., up to about $5 \times 10^{15}$ cm$^{-2}$) at the shallow target projected range $R_p(S)$. The implantation is followed by a post-implant anneal at 800-1100° C. for up to one hour in an inert ambient.

The ohmic contacts 88, 90 are formed on the top and bottom surfaces 84, 90 of the semiconductor device 70 (block 110).

Figure 14:
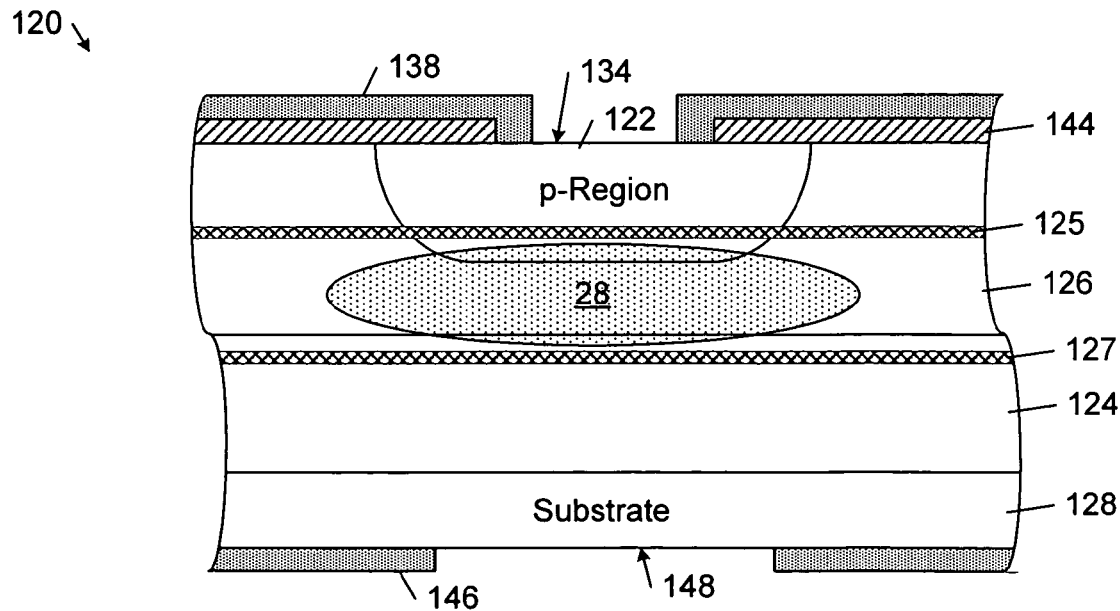
FIG. 14 is a diagrammatic sectional view of a third embodiment in accordance with the invention of the semiconductor device shown in FIG. 1.

FIG. 14 shows a sectional view of an embodiment of a semiconductor device 120 that corresponds to a third embodiment in accordance with the invention of the semiconductor device 10. In this embodiment, first and second regions 125, 127 of local crystal modifications are created by epitaxial growth methods.

In some embodiments in accordance with the invention, the first and second LCM regions 125, 127 are formed by incorporating one or more different Group IV elements into the crystal structure during the growth phase of a host epitaxial layer of Group IV semiconductor material. The incorporated Group IV elements have a different sizes and/or lattice constants from the host material. As a result, these incorporated elements will introduce local strain in the host material that increases the bandgap. The first and second LCM regions 125, 127 may include an array of atoms, an array of clusters of atoms, or one or more layers of atoms.

The semiconductor device 120 includes a p-region 122, an n-region 124, and an intrinsic region 126. The n-region 124 corresponds to an n-type epitaxial layer that is grown on a Group IV semiconductor substrate 128. The intrinsic region 126 corresponds to an undoped epitaxial Group IV semiconductor layer that is grown on the n-type epitaxial layer. The p-region 122 corresponds to a region of the intrinsic epitaxial layer that is doped p-type. The semiconductor device 120 additionally includes the first epitaxial region 125 of local crystal modifications that is grown epitaxially in the p-region 122 and the second epitaxial region 127 of local crystal modifications that is grown epitaxially in the n-region 124.

The semiconductor device 120 also includes a top ohmic electrical contact 138 on a top surface 134 and a bottom ohmic electrical contact 140 on a bottom surface 142 of the substrate 128. The top electrical contact 138 is electrically isolated from the intrinsic region 126 by a layer 144 of electrically insulating material (e.g., silicon dioxide or silicon nitride). The electrical contact 138 may connect the p-region 122 to a source of a forward bias and the electrical contact 90 may-connect the n-region to ground potential. In response to an applied forward bias, electrons and holes are injected into the accumulation region 28 where they are confined by the first and second epitaxial regions 125, 127. The injected carriers recombine in the charge accumulation region 28. The light that is generated by the recombining holes and electrons may be emitted, for example, through the top surface 84, or bottom surface 92.

Some embodiments in accordance with the invention of the semiconductor device 120 may additionally include a third region of local crystal modifications that extends across the region of the device between the first and second strain layers 125, 127. In these embodiments, the third region of local crystal modifications may inhibit lateral diffusion of the injected carriers from the charge accumulation region 28.

Figure 15:
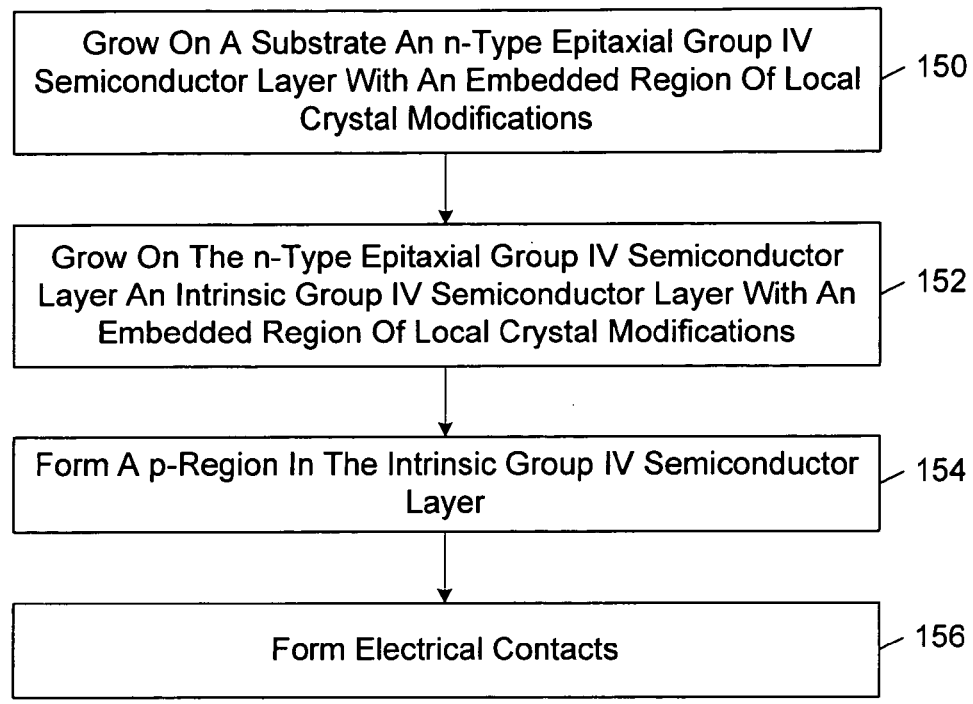
FIG. 15 is a flow diagram of an embodiment in accordance with the invention of a method of fabricating the semiconductor device shown in FIG. 14.

FIG. 15 shows an embodiment in accordance with the invention of a method of fabricating the semiconductor device 120.

In accordance with this embodiment in accordance with the invention, an n-type epitaxial Group IV semiconductor layer with an embedded epitaxial region of local crystal modifications is formed on a substrate (block 150). In general, the substrate may be formed of any type of material that supports epitaxial growth of the n-type epitaxial Group IV semiconductor layer. The substrate may be, for example, a Group IV semiconductor substrate. In some embodiments in accordance, with the invention, the n-type epitaxial Group IV semiconductor layer is doped with an n-type dopant at a concentration level of at least $1 \times 10^{18}$ cm$^{-3}$. The embedded epitaxial region of local crystal modifications corresponds to a region of material that induces strain in the n-type epitaxial Group IV semiconductor layer. The epitaxial region of local crystal modifications may be, for example, a semiconductor layer that has a different lattice constant than the n-type epitaxial Group IV semiconductor layer in the growth plane. The epitaxial region of local crystal modifications also may be, for example, a semiconductor layer with excess in-grown interstitial atoms that, when annealed, aggregate to form defects (e.g., dislocation loops, interstitial clusters, or rod-like defects) that introduce strain.

An intrinsic (i.e., undoped) epitaxial Group IV semiconductor layer with an embedded epitaxial region of local crystal modifications is grown on the n-type epitaxial Group IV semiconductor layer (block 152). In general, the intrinsic Group IV semiconductor layer may be formed of any Group IV semiconductor that is capable of being grown epitaxially on the underlying n-type epitaxial Group IV semiconductor layer. In some embodiments in accordance with the invention, the intrinsic Group IV semiconductor and the n-type epitaxial layer have identical compositions. The embedded epitaxial region of local crystal modifications corresponds to a region of material that induces strain in the intrinsic epitaxial Group IV semiconductor layer. The epitaxial region of local crystal modifications may be, for example, a semiconductor layer that has a different lattice constant than the intrinsic epitaxial Group IV semiconductor layer in the growth plane, or a semiconductor layer with excess grown-in interstitial atoms that, upon annealing, aggregate to form strain-inducing defects (e.g., dislocation loops, interstitial clusters, or rod-like defects). After the intrinsic Group IV semiconductor layer is formed (block 152), a p-type region is formed in the intrinsic epitaxial Group IV semiconductor layer (block 154). The p-region is formed by doping the intrinsic epitaxial Group IV semiconductor layer with a p-type dopant (e.g., boron) to achieve a peak concentration that is at least $1 \times 10^{18}$ cm$^{-3}$ at the target projected range $R_p(A)$.

After the p-region is formed (block 154), ohmic electrical contacts are formed (block 156). The electrical contacts may be formed using any one of a wide variety of different processes for forming ohmic electrical contacts.

EXAMPLE 3

In one exemplary embodiment in accordance with the invention of the method shown in FIG. 15, the semiconductor device 120 is formed on a silicon substrate 128. The n-type epitaxial layer 124 is formed (block 150) by growing a layer of n-type epitaxial silicon on the substrate 128 or on an epitaxial buffer layer. In this embodiment, the n-type epitaxial layer is doped with an n-type dopant at a concentration of at least $1 \times 10^{18}$ cm$^{-3}$. The epitaxial region 127 of local crystal modifications, which is embedded in the n-type epitaxial silicon layer 124, is formed by growing a layer of material (e.g., SiGeC or SiGe) that induces strain in the n-type epitaxial silicon layer 124. The LCM region 127 also may be grown under different growth conditions, for example, at a lower temperature, such that excess group IV interstitial atoms are incorporated in the layer. When annealed, these interstitials aggregate to form strain-inducing dislocations.

The intrinsic epitaxial layer 126 is formed (block 152) by growing a layer of undoped epitaxial silicon on the n-type epitaxial silicon layer 124. The epitaxial region 125 of local crystal modifications, which is embedded in the intrinsic epitaxial layer 126, is formed by growing a layer of material (e.g., SiGeC or SiGe) that induces strain in the intrinsic epitaxial silicon layer 126. The LCM region 125 also may be grown under different growth conditions, for example, at a lower temperature, such that excess group IV interstitial atoms are incorporated in the layer. When annealed, these interstitials aggregate to form strain-inducing dislocations.

The p-region 122 is formed (block 154) by implanting a p-type dopant (e.g., boron) in the intrinsic epitaxial silicon layer 126. The implantation dose and energy are selected to achieve a target peak dopant concentration that is at least $10^{18}$ cm$^{-3}$.

The ohmic contacts 138, 146 are formed on the top and bottom surfaces is 134, 148 of the semiconductor device 120 (block 156).

Other embodiments in accordance with the invention are within the scope of the claims.

For example, in the embodiments in accordance with the invention described above, the p-regions are located above the n-regions. In other embodiments, the n-regions may be located above the p-regions. In addition, the top n- and p-regions may be epitaxially grown with a selected dopant profile rather than being formed by an implanted dopant profile, as shown in the illustrated embodiments.

Some embodiments in accordance with the invention may incorporate Group IV element nanostructures in the charge accumulation regions of respective ones of the above-described semiconductor device embodiments.

Figure 16:
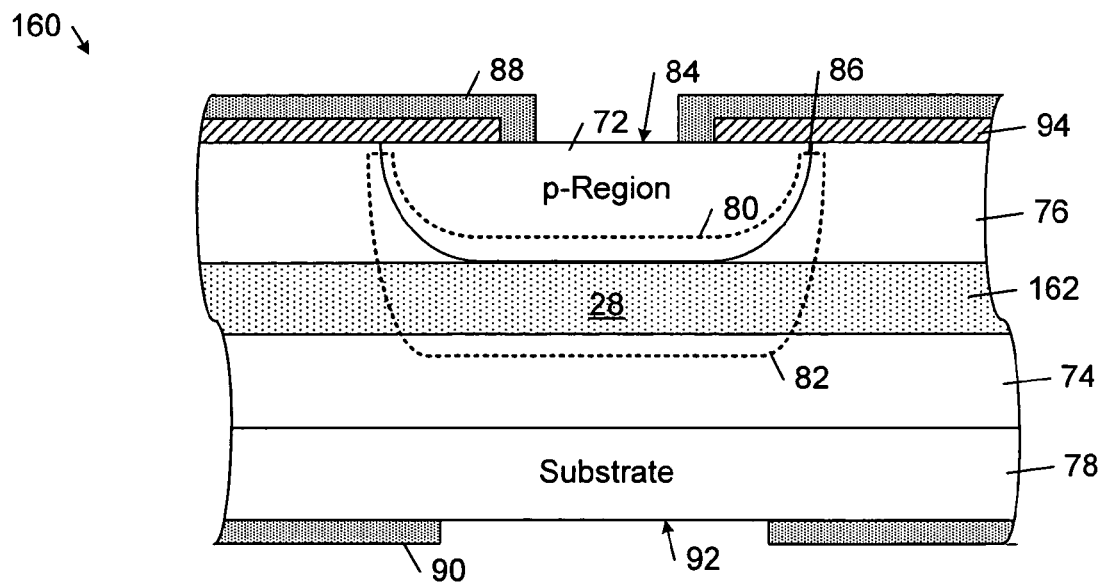
FIG. 16 is a diagrammatic sectional view of a fourth embodiment in accordance with the invention of the semiconductor device shown in FIG. 1.

FIG. 16 shows an embodiment in accordance with the invention of a semiconductor device 160 that corresponds to a fourth embodiment of the semiconductor device 10. The semiconductor device 160 includes Group IV element nanostructures 162 that are embedded in the material of the charge accumulation region 28. The Group IV element nanostructures may be, for example, quantum dots that are formed of Ge or Si/Sn.

In some embodiments in accordance with the invention, Ge quantum dots are formed as follows. First a monolayer of Sb is deposited as a wetting layer, then a four-monolayer Si/four-monolayer Ge superlattice grown at a temperature of 550° C. The superlattice has 4 periods, followed by a 5 nm Si layer and then four more superlattice periods. In some of these embodiments in accordance with the invention, the resulting superlattice self-organizes into Ge quantum dots. In other ones of these embodiments in accordance with the invention, the superlattice is annealed during growth to form Ge quantum dots.

In other embodiments in accordance with the invention, Ge quantum dots are formed by growing Ge on Si. The Ge initially wets the Si surface and grows planar layers up to three monolayers at which point the Ge starts forming islands. These islands are capped with a silicon layer to form the Ge quantum dots.

In some embodiments, Si/Sn quantum dots are formed as follows. At a low temperature (e.g., below 400° C.), very thin (e.g., 1-4 nm thick) SiSn alloy 15 layers are grown on Si. Si is grown on the alloy layers to embed the SiSn alloy layers in silicon. The alloy layers are annealed to form Si/Sn quantum dots embedded in silicon.

What is claimed is:

1. A semiconductor device, comprising:
   a p-region comprising a first Group IV semiconductor having a bandgap and doped with a p-type dopant, and a first region of local crystal modifications inducing localized strain that increases the bandgap of the first Group IV semiconductor and creates a conduction band energy barrier against transport of electrons across the p-region; and
   an n-region comprising a second Group IV semiconductor having a bandgap and doped with an n-type dopant, and a second region of local crystal modifications inducing localized strain that increases the bandgap of the second Group IV semiconductor and creates a valence band energy barrier against transport of holes across the n-region.

2. The device of claim 1, wherein each of the first Group IV semiconductor and the second Group IV semiconductor comprises at least one of silicon and germanium.

3. The device of claim 1, wherein the first Group IV semiconductor and the second Group IV semiconductor have substantially identical compositions.

4. The device of claim 3, wherein the first Group IV semiconductor and the second Group IV semiconductor are silicon.

5. The device of claim 1, wherein the first Group IV semiconductor is doped with a p-type dopant concentration of at least $1 \times 10^{18}$ cm$^{-3}$.

6. The device of claim 1, wherein the second Group IV semiconductor is doped with an n-type dopant concentration of at least $1 \times 10^{18}$ cm$^{-3}$.

7. The device of claim 1, further comprising between the p-region and the n-region a third region comprising a third Group IV semiconductor having a dopant concentration less than the dopant concentrations of the p-region and the n-region.

8. The device of claim 7, wherein each of the third region and at least one of the p-region and the n-region corresponds to a respective epitaxial semiconductor layer.

9. The device of claim 7, wherein the first Group IV semiconductor, the second Group IV semiconductor, and the undoped Group IV semiconductor have substantially identical compositions.

10. The device of claim 1, wherein the p-region and the n-region respectively are defined by implant profiles of the p-type dopant and the n-type dopant in a shared Group IV semiconductor substrate.

11. The device of claim 1, wherein the first region of local crystal modifications and the second region of local crystal modifications are separated by at least 50 nm.

12. The device of claim 1, wherein the first region of local crystal modifications and the second region of local crystal modifications comprise respective arrays of crystal defects.

13. The device of claim 12, wherein the crystal defects comprise aggregations of excess interstitial Group IV semiconductor atoms.

14. The device of claim 1, wherein at least one of the first region of local crystal modifications and the second region of local crystal modifications comprises a layer of material inducing strain in the corresponding one of the first and second Group IV semiconductors.

15. The device of claim 1, further comprising a third region of local crystal modifications at a periphery of the device, the third region creating an energy band barrier against transport of charge carriers from a charge accumulation region between the first region of local crystal modifications and the second region of local crystal modifications.

16. The device of claim 15, wherein the first, second, and third regions of local crystal modifications collectively surround the charge accumulation region.

17. The device of claim 15, wherein the third region comprises an array of crystal defects.

18. The device of claim 1, further comprising nanostructures formed of Group IV semiconductor atoms and embedded between the first region of local crystal modifications and the second region of local crystal modifications.

19. The device of claim 1 enabled such that, in response to an applied forward bias, holes from the p-region and electrons from the n-region radiatively recombine in a charge accumulation region between the first region of local crystal modifications and the second region of local crystal modifications.

20. A method of fabricating a semiconductor device, comprising:
   forming a first region of local crystal modifications in a p-region comprising a first Group IV semiconductor having a bandgap and doped with a p-type dopant, the first region of local crystal modifications inducing localized strain that increases the bandgap of the first Group IV semiconductor and creates a conduction band energy barrier against transport of electrons across the p-region;
   forming a second region of local crystal modifications in an n-region comprising a second Group IV semiconductor having a bandgap and doped with an n-type dopant, the second region of local crystal modifications inducing localized strain that increases the bandgap of the second Group IV semiconductor and creates a valence band energy barrier against transport of holes across the n-region.

21. The method of claim 20, each of the first Group IV semiconductor and the second Group IV semiconductor comprises at least one of silicon and germanium.

22. The method of claim 20, wherein the first Group IV semiconductor and the second Group IV semiconductor have substantially identical compositions.

23. The method of claim 20, wherein at least one of the first and second Group IV semiconductors is doped with a respective dopant concentration of at least $1 \times 10^{18}$ cm$^{-3}$.

24. The method of claim 20, wherein the forming of at least one of the barriers comprises creating an array of crystal defects in the corresponding Group IV semiconductor.

25. The method of claim 24, wherein the creating of the array of crystal defects comprises implanting an atomic species in at least one of the Group IV semiconductors and annealing the implanted Group IV semiconductor to activate the implanted atomic species and aggregate excess interstitial Group IV semiconductor atoms.

26. The method of claim 20, further comprising forming between the p-region and the n-region a third region comprising a Group IV semiconductor having a dopant concentration less than the dopant concentrations of the p-region and the n-region.

27. The method of claim 26, wherein each of the third region and at least one of the p-region and the n-region corresponds to a respective epitaxial layer.

28. The method of claim 26, wherein the first Group IV semiconductor, the second Group IV semiconductor, and the undoped Group IV semiconductor have substantially identical compositions.

29. The method of claim 20, wherein the p-region and the n-region respectively are defined by implant profiles of the p-type dopant and the n-type dopant in a shared Group IV semiconductor substrate.

30. The method of claim 20, wherein the first region of local crystal modifications and the second region of local crystal modifications are separated by at least 50 nm.

31. The method of claim 20, wherein the forming of at least one of the barriers comprises forming a layer of material inducing strain in the corresponding one of the first and second Group IV semiconductors.

32. The method of claim 20, wherein the forming of at least one of the regions of local crystal modification comprises epitaxially growing into the corresponding Group IV semiconductor an interstitial atomic species and annealing the corresponding Group IV semiconductor to aggregate the interstitial atomic species to form defects inducing strain in the corresponding Group IV semiconductor.

33. The method of claim 20, further comprising forming a third region of local crystal modifications at a periphery of the device, the third region creating an energy band barrier against transport of charge carriers from a charge accumulation region between the first region of local crystal modifications and the second region of local crystal modifications.

34. The method of claim 33, wherein the first, second, and third regions of local crystal modifications collectively surround the charge accumulation region.

35. The method of claim 33, wherein the forming of the third region comprises creating an array of crystal defects in the at least one doped Group IV semiconductor region.

36. The method of claim 20, further comprising epitaxially forming nanostructures of Group IV semiconductor atoms between the first region of local crystal modifications and the second region of local crystal modifications.

* * * * *